United States Patent
Zhang et al.

(10) Patent No.: US 9,513,752 B2
(45) Date of Patent: Dec. 6, 2016

(54) CAPACITIVE TOUCH PANEL, DISPLAY DEVICE AND METHOD FOR MANUFACTURING THE TOUCH PANEL

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Jiaxiang Zhang, Beijing (CN); Xiaohui Jiang, Beijing (CN); Jian Guo, Beijing (CN); Xu Chen, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/345,040

(22) PCT Filed: Jul. 10, 2013

(86) PCT No.: PCT/CN2013/079122
§ 371 (c)(1),
(2) Date: Mar. 14, 2014

(87) PCT Pub. No.: WO2014/173022
PCT Pub. Date: Oct. 30, 2014

(65) Prior Publication Data
US 2015/0145811 A1    May 28, 2015

(30) Foreign Application Priority Data
Apr. 25, 2013    (CN) .......................... 2013 1 0148656

(51) Int. Cl.
*G06F 3/044* (2006.01)
*C23F 1/02* (2006.01)
*H05K 3/06* (2006.01)

(52) U.S. Cl.
CPC ................ *G06F 3/044* (2013.01); *C23F 1/02* (2013.01); *H05K 3/06* (2013.01); *G06F 2203/04103* (2013.01); *G06F 2203/04112* (2013.01)

(58) Field of Classification Search
CPC ................ G06F 3/044; G06F 3/0412; G06F 2203/04103; G06F 3/041; C23F 1/02; H05K 3/06
USPC .................................................. 345/173, 174
See application file for complete search history.

(56) References Cited

U.S. PATENT DOCUMENTS

2009/0128518 A1* 5/2009 Kinoshita et al. ............ 345/174
2010/0013745 A1* 1/2010 Kim et al. ...................... 345/76
(Continued)

FOREIGN PATENT DOCUMENTS

| CN | 101859213 A | 10/2010 |
| CN | 102023770 A | 4/2011 |

(Continued)

OTHER PUBLICATIONS

International Search Report mailed Jan. 30, 2014; PCT/CN2013/079122.
International Preliminary Report on Patentability Appln. No. PCT/CN2013/049122.
First Chinese Office Action dated Sep. 26, 2016; Appln. No. 201310148656.3.

*Primary Examiner* — Dmitriy Bolotin
(74) *Attorney, Agent, or Firm* — Ladas & Parry LLP

(57) ABSTRACT

An embodiment of the present application discloses a capacitive touch panel including a base substrate, on which a plurality of transparent conductive patters being capable of transmitting touch signals and not overlapping with each are provided, and each transparent conductive pattern is an integrated pattern made of a same material layer. An embodiment of the present application further provides a method for manufacturing a capacitive touch panel, which includes forming a plurality of transparent conductive patterns on a base substrate through one mask patterning process. An embodiment of the present application further includes a display device comprising the capacitive touch panel as described above. An embodiment of the present application can save masks and can manufacture capacitive touch panels at a low cost. Furthermore, the embodiments of the present application have advantages of high production efficiency and of high yield rate.

18 Claims, 3 Drawing Sheets

(56) References Cited

U.S. PATENT DOCUMENTS

| | | | |
|---|---|---|---|
| 2010/0214247 A1* | 8/2010 | Tang et al. | 345/173 |
| 2010/0261119 A1 | 10/2010 | Li et al. | |
| 2010/0295819 A1* | 11/2010 | Ozeki et al. | 345/174 |
| 2011/0069033 A1 | 3/2011 | Meng et al. | |
| 2011/0279405 A1* | 11/2011 | Meng | G06F 3/044 345/174 |
| 2012/0227259 A1* | 9/2012 | Badaye | G06F 3/044 29/846 |

FOREIGN PATENT DOCUMENTS

| | | |
|---|---|---|
| CN | 102841718 A | 12/2012 |
| JP | 2009-122969 A | 6/2009 |

* cited by examiner

CAPACITIVE TOUCH PANEL, DISPLAY DEVICE AND METHOD FOR MANUFACTURING THE TOUCH PANEL

TECHNICAL FIELD

Embodiments of the present invention relate to a capacitive touch panel, a display panel and a method for manufacturing the touch panel.

BACKGROUND

A touch panel, also called a touch screen, is an inductive liquid crystal display panel capable of receiving touch input signals. When an icon button displayed on the touch screen is contacted, a tactile feedback system on the screen can drive various connected devices on basis of pre-programmed programs and can present various information by means of pictures displayed on the liquid crystal display.

Currently, touch screens can be classified into four kinds: resistive touch screens, capacitive touch screens, surface acoustic wave touch screens, and infrared ray touch screens. Capacitive touch screens are widely applied due to advantages such as low costs, being easy to implement multi-point touch and etc. FIG. 1 illustrates a schematic structural of a touch panel of an existing capacitive touch screen. Such a bridge structure can be formed by firstly forming an indium tin oxide (ITO) or a metal conducting bridge structure 1 through a first mask process, then forming an insulating layer (not illustrated in the figure) by means of a plasma enhanced chemical vapor deposition (PECVD), forming via holes 2 at two ends of the bridge structure 1 by means of a second mask process, wherein a conductive metal strip is located below the holes 2, and finally forming conductive ITO pattern by means of a third mask process. In the structure as illustrated in FIG. 1, a plurality of ITO patterns in a row are conducted through the bridge structure 1 and the via holes 2. The ITO patterns in a row each has a same shape and a same area in the bridge structure as illustrated in FIG. 1. When a human's finger or other conductor touches the surface of the touch panel, an electric signal is generated due to mutual capacitance effect and self-capacitance effect, and is feedback to a lateral sensing line and to a vertical sensing line (as illustrated in FIG. 1, the lines drawn out at the left and right sides are lateral sensing lines 4 and the lines drawn out at the bottom side are vertical sensing lines 5). The sensing lines supply the electric signals to a controller and the controller identifies and correspondingly determines the coordinates x, y of the touch point so as to implement a touch operation. As such a structure generally requires three mask processes, its costs are high and it has a low production efficiency and a low yield rate.

SUMMARY

In view of the above, a main purpose of embodiments of the present application is to provide a capacitive touch panel, a display device and a method for manufacturing the touch panel so as to solve the problems existing in current capacitive touch panels, such as high cost, low production efficiency and low yield rate.

In order to achieve above purposes, the embodiments of the present application provides a technical solution as below.

An embodiment of the present application provides a capacitive touch panel, comprising a base substrate, on which a plurality of transparent conductive patterns having a function of transmitting touch signals and not overlapping each other are provided, wherein each transparent conductive pattern is of an integrated pattern made of a same material layer.

Preferably, for example, each transparent conductive pattern is of an integrated pattern made of a same material layer through one mask patterning process.

Preferably, for example, each transparent conductive pattern comprises a plurality of sub-patterns connected to each other.

Preferably, for example, among the plurality of transparent conductive patterns, neighboring edges of at least one pair of adjacent transparent conductive patterns are parallel to each other.

Preferably, for example, the plurality of transparent conductive patterns are arranged to each other in a first direction of the capacitive touch panel.

Preferably, for example, edges of two adjacent transparent conductive patterns are of gear engagement.

Preferably, for example, the transparent conductive patterns each have a same shape.

Preferably, for example, the transparent conductive patterns transmit the touch signals through sensing lines arranged in edge regions at two sides of the capacitive touch panel, respectively.

Preferably, for example, edge lines of the sub-pattern have a shape comprising one or more of polygon line, sawtooth line, arc line, wavy line, and irregular line.

Preferably, for example, areas of sub-pattern in every transparent conductive pattern are not all equal to each other.

An embodiment of the present application further provide a display device, which comprises the capacitive touch panel as described above.

Preferably, the display device further comprises a display panel, the capacitive touch panel has a signal communication with the display panel, and the capacitive touch panel transmits obtained touch signals to the display panel.

Preferably, the display device further comprises a thin film transistor array substrate, the capacitive touch panel is cell-assembled together with the thin film transistor array substrate so as to form the display device.

An embodiment of the present application further provides a method for manufacturing a capacitive touch panel as described above, the method comprising: forming the plurality of transparent conductive patterns on the base substrate through one mask patterning process.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise stated, technical terms or scientific terms used herein should be construed as general meanings that those skilled in the art understand. The wordings "first", "second" and the like are not used to denote any of sequence, amount or importance, they are just used to distinguish different components. Similarly, The terms "a", "an", and the like are not limitative to the quantity thereof, and only denote the presence of at least one of an element. The terms "comprising", "including" and the like means that the element or the thing before the terms "comprising" or "including" contains elements or things and the like listed behind the terms "comprising" or "including", and do not exclude other elements or things. The terms "connection" or "link" are not limited to a physical or mechanical connection or link, and may also comprise electrical connection, whatever direct or indirect. The terms "on", "below", "left", "right" and the like are only intended to denote relative positional relationship of objects, and the relative positional relationship may change correspondingly if absolute positions of the described objects change.

The capacitive touch panel according to an embodiment of the present application comprises a base substrate, on which a plurality of transparent conductive patterns, having a function of transmitting touch signals and not overlapping with each other, are provided, and each transparent conductive pattern is of an integrated pattern made of a same material layer. Compared with the conventional bridge type capacitive touch panel, the capacitive touch panel has advantages, such as no requirement to modify the manufacturing device (for example, not increasing the amount of sensing lines and the amount of IC pins), a low manufacturing cost, a high production efficiency, a high yield rate, etc.

The capacitive touch panel structure as mentioned above is hereinafter described through a specific embodiment of the present application.

Figure 1:
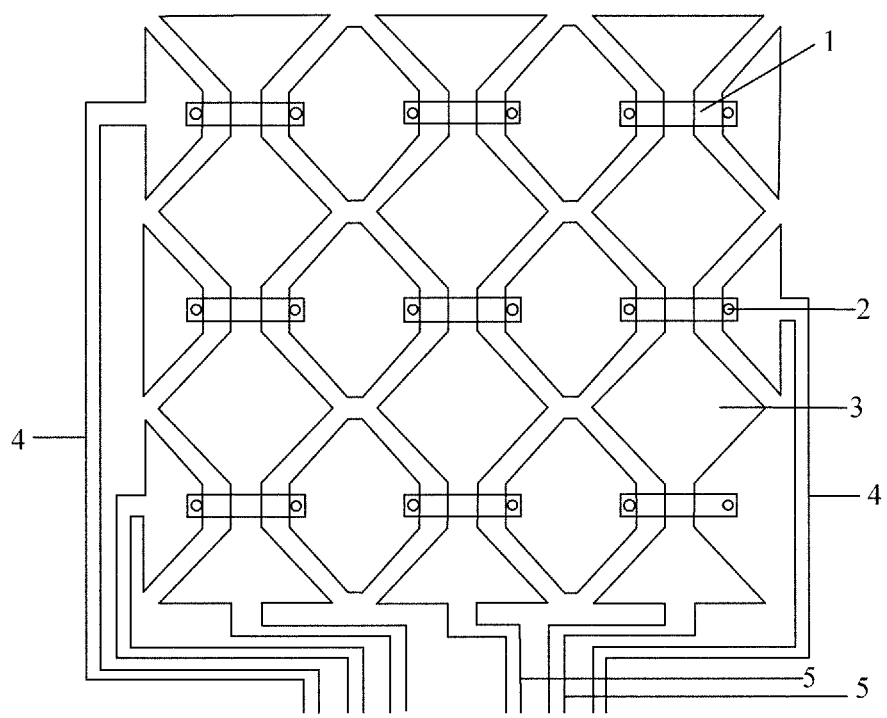
FIG. 1 is a schematic structural diagram of a touch panel of a conventional capacitive touch screen.
Figure 2:
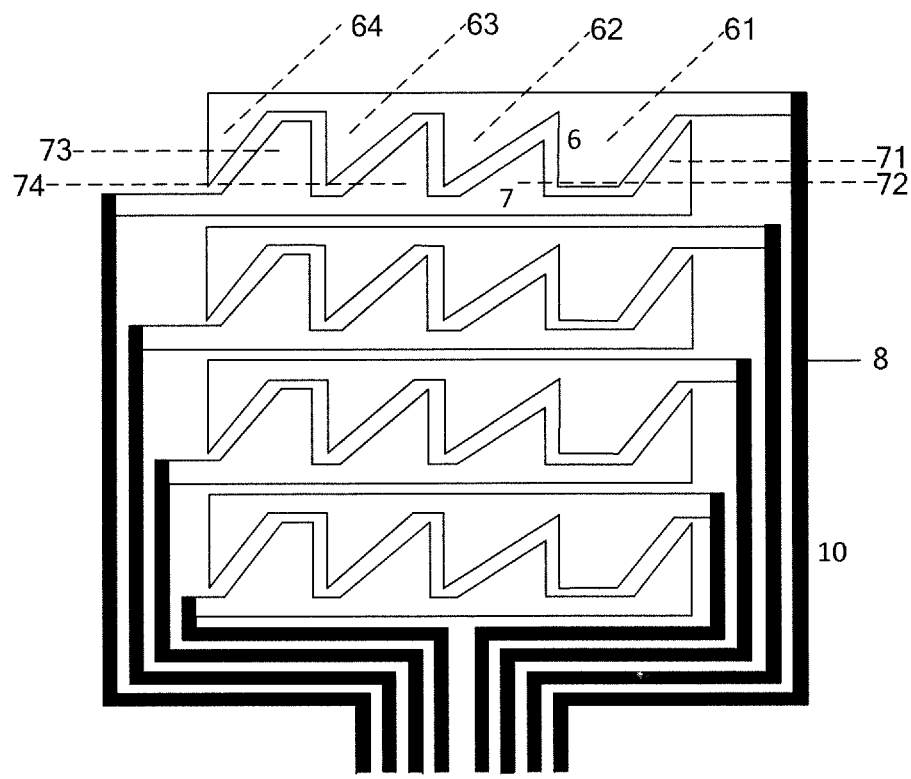
FIG. 2 is a schematic structural diagram of a capacitive touch panel according to a first embodiment of the present application.

FIG. 2 illustrates a schematic structure diagram of a preferable capacitive touch panel according to a first embodiment of the present application, and each transparent conductive pattern is an integrated pattern made of a same material layer through one mask patterning process. Each transparent conductive pattern preferably comprises a plurality of sub-patterns connected to each other. Compared with conductive regions connected by means of via holes in the conventional technology, patterns according to the embodiment of the present application are formed in an integrate mode, and the sub-patterns of the transparent conductive patterns are integrated and needs not to be connected by means of via holes.

Optionally, for example, edge lines of the sub-patterns are in a shape comprising one or more of polygon line, sawtooth line, arc line, wavy line, and irregular line. Preferably, for example, areas of the sub-patterns of each transparent conductive pattern are not all equal to each other (and further, areas of the patterns on the touch panel are not all equal to each other); the sub-patterns of each transparent conductive pattern each have a same shape or not a same shape (and further, patterns on the touch panel each have a same shape or not a same shape). As illustrated in the drawing, sub-patterns 61, 62, 63 and 64 are connected to each other and form a transparent conductive pattern 6; and sub-patterns 71, 72, 73 and 74 are connected to each other and form a transparent conductive pattern 7. In this embodiment, sub-patterns of each transparent conductive pattern may be of two shapes, triangle (for example, sub-patterns 62, 63 and 64) and trapezoid (for example, sub-pattern 61). In this embodiment, areas of the sub-patterns of every transparent conductive pattern are not all equal to each other. For example, areas of sub-patterns 61, 62, 63 and 64 are not equal to each other, and areas of sub-patterns 71, 72, 73 and 74 are not equal to each other.

It need to be pointed out that, in the first embodiment of the present application, the transparent conductive pattern is made of a transparent conductive material, each transparent conductive pattern preferably transmit touch signals through sensing lines arranged in edge regions at two sides of the capacitive touch panel, respectively, and each transparent conductive pattern corresponds to one sensing line. As illustrated in FIG. 2, the transparent conductive pattern 6 transmits touch signals through a sensing line 8. As the areas of the sub-patterns of every transparent conductive pattern is not all equal to each other, different sub-pattern regions will produce different capacitance effect (mutual capacitance effect and self-capacitance effect), and correspondingly, electric signals generated are different. Upon receiving electric signals transmitted from the sensing lines, a controller can position a corresponding region by means of the sensing line transmitting the signals and by analyzing the electric signals, and thus, the touch position can be located accurately. (If the patterns on the touch panel each have different areas, the corresponding region can be located by only analyzing electric signals.)

It needs to be explained further that, in the first embodiment, the case in which the sub-patterns each have different areas just involves a preferable example, and the embodiment may further cover the case in which the sub-patterns each have a same area, or both a same shape and a same area. In these cases, the position at which the touch signals are generated still can be recognized by identifying respective connected sensing lines. Even though the accuracy is relatively lower compared with the situation in which sub-patterns each have different areas, the function of touch control still can be realized by transmitting touch signals through transparent conductive patterns and sensing lines, the technical problem solved by "the integrated transparent conductive pattern" is also solved. Thus, a technical effect that the transparent conductive patterns need not to be formed in multiple steps such that manufacturing costs is reduced can be realized.

In the first embodiment, optionally, for example, the transparent conductive patterns each can also have a same shape; the transparent conductive patterns can be aligned parallel to each other in a first direction on the capacitive touch panel. Herein, the first direction can be the lateral direction or the vertical direction. In the structure as illustrated in FIG. 2, the transparent conductive patterns are aligned along the vertical direction, while sub-patterns comprised in each transparent conductive pattern are aligned along a lateral direction. Further, in the structure as illustrated in FIG. 2, neighboring edge lines of at least one pair of adjacent transparent conductive patterns are parallel to each other. For example, neighboring edge lines of transparent conductive patterns 6 and 7 are parallel to each other, and the transparent conductive patterns 6 and 7 are two adjacent transparent conductive patterns. Edges of the two adjacent transparent conductive patterns 6 and 7 are in the form of engaged gears. It should be noted that, the gear engagements as described herein are not limited to gears having regular shapes, but may cover arrangement manners such as mutual clutching, inosculating and engaging of teeth of various shapes.

Figure 3:
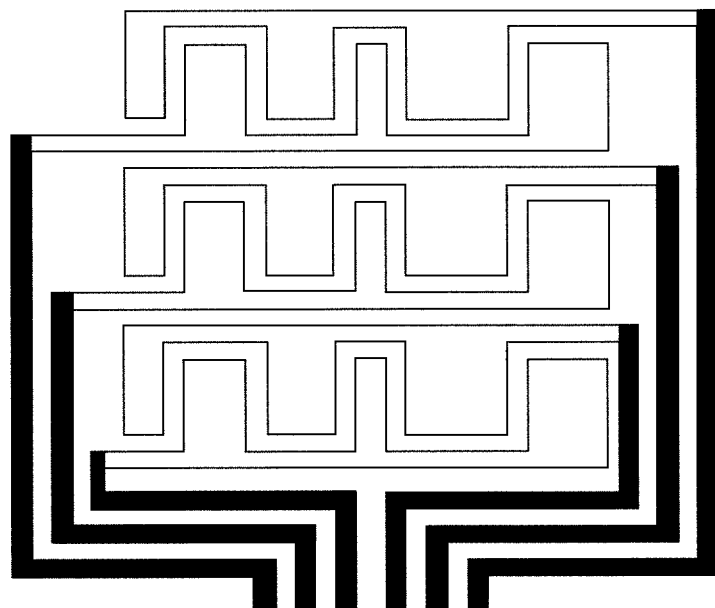
FIG. 3 is a schematic structural diagram of a capacitive touch panel according to a second embodiment of the present application.

FIG. 3 illustrates a schematic structure diagram of another preferable capacitive touch panel according to a second embodiment of the present application. The structure is substantively identical to the structure as illustrated in FIG. 2, while the only difference is that the sub-patterns of every transparent conductive pattern each have a same shape, which is a rectangle.

An embodiment of the present application further provide a method for manufacturing the capacitive touch panel as described above, the method comprising: forming the plurality of transparent conductive patterns on a base substrate through one mask patterning process, i.e., with one mask. The one mask patterning process comprises but is not limited to the following steps: coating photoresist, exposing, developing, etching and removing.

An embodiment of the present application further provides a display device comprising the capacitive touch panel as described above.

Figure 4:
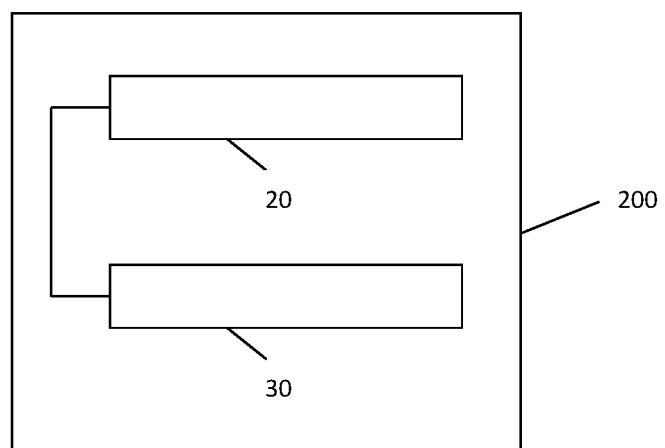
FIG. 4 is a schematic diagram of display device comprising a display panel and the touch panel according to the present application.

Preferably, as shown in FIG. 4, for example, the display device 200 further comprises a display panel 30, the capacitive touch panel 20 communicates with the display panel 30 and the capacitive touch panel 20 transmits obtained touch signals to the display panel 30. The display panel 30 can be a display panel of any type, such as a liquid crystal display panel, an electroluminescence display panel, a electrophoresis display panel, etc. The base substrate of the capacitive touch panel that forms a display device with a display panel can be a single glass substrate.

Or, preferably, the display device further comprises a thin film transistor (TFT) array substrate. The capacitive touch panel 20 is cell-assembled together with the thin film transistor array substrate so as to form a display device. The base substrate of the capacitive touch panel, which forms a display device together with the TFT array substrate, is an opposite substrate of the TFT array substrate. And the opposite substrate can be a color filter (CF) substrate or a single glass substrate (in this case the color filter layer being disposed on the TFT array substrate). Under this circumstance, the display device can be of any type. For example, if the display device is a liquid crystal display device, a liquid crystal layer is further disposed between the capacitive touch panel and the TFT array substrate which are cell-assembled together. If the display device is an electroluminescence display device, an electroluminescence light emitting layer is further disposed between the TFT array substrate and the capacitive touch panel. Of course, the display device can be a display device of other types, and is not limited to the two types as described above.

The transparent conductive patterns of the capacitive touch panel according to an embodiment of the present application are integrated and can be formed through one mask patterning process. Compared with the conventional capacitive touch panel having a bridge structure, the capacitive touch panel has advantages such as saving masks, no need to modify the manufacturing device (for example, the amount of sensing lines and of IC pins are not increased), a low manufacturing cost, a high production efficiency, a high yield rate, etc.

In the embodiments of the present application, the meaning of the term "patterning process" covers all processes capable of forming desired patterns, comprising mask technology used in conventional patterning processes for a display substrate, such as coating photoresist, developing, etching, removing, etc., and may further comprising other processes such as printing technology. In implementations of the present application, all the processes that can form desired transparent conductive patterns fall into the protection scope of the present application.

The foregoing are merely exemplary embodiments of the invention, but are not used to limit the protection scope of the invention. The protection scope of the invention shall be defined by the attached claims.

The invention claimed is:

1. A capacitive touch panel comprising a base substrate on which a plurality of transparent conductive patterns are provided, wherein each transparent conductive pattern is a unitary pattern, the plurality of transparent conductive patterns being capable of transmitting touch signals and not overlapping with each other, wherein each of the transparent conductive patterns is of an integrated pattern made of a same material on a same layer, wherein each transparent conductive pattern has a comb shape comprising a plurality of teeth having different areas and each transparent conductive pattern forms a row or a column of the capacitive touch panel, and each transparent conductive pattern corresponds to one sensing line and transmits touch signals therethrough.

2. The capacitive touch panel according to claim 1, wherein each of the transparent conductive patterns is of an integrated pattern made of the same material on the same layer through one mask patterning process.

3. The capacitive touch panel according to claim 2, wherein all the plurality of transparent conductive patterns are arranged parallel to each other in a first direction of the capacitive touch panel.

4. The capacitive touch panel according to claim 2, wherein each edge line of the plurality of transparent conductive patterns has a shape comprising one or more of polygon line, sawtooth line, arc line, wavy line and irregular line.

5. The capacitive touch panel according to claim 1, wherein, among the plurality of transparent conductive patterns, neighboring edge lines of at least one pair of adjacent transparent conductive patterns are parallel to each other.

6. The capacitive touch panel according to claim 1, wherein all the plurality of transparent conductive patterns are arranged parallel to each other in a first direction of the capacitive touch panel.

7. The capacitive touch panel according to claim 1, wherein edges of adjacent two transparent conductive patterns are in a form of gear engagement.

8. The capacitive touch panel according to claim 1, wherein the transparent conductive patterns each have a same shape.

9. The capacitive touch panel according to claim 1, wherein the transparent conductive patterns transmit the tough signals through sensing lines arranged in two edge regions of the capacitive touch panel.

10. The capacitive touch panel according to claim 1, wherein edge lines of the plurality of transparent conductive patterns has a shape comprising one or more of polygon line, sawtooth line, arc line, wavy line and irregular line.

11. A display device comprising the capacitive touch panel according to claim 1.

12. A display device according to claim 11, further comprising a display panel, the capacitive touch panel being connected to the display panel, the capacitive touch panel transmitting obtained touch signals through a sensing line.

13. A display panel according to claim 11, further comprising a thin film transistor array substrate.

14. A method for manufacturing a capacitive touch panel, the touch panel comprising a base substrate on which a plurality of transparent conductive patterns are provided, wherein each transparent conductive pattern is a unitary pattern, the plurality of transparent conductive patterns being capable of transmitting touch signals and not overlapping with each other, wherein each of the transparent conductive patterns is of an integrated pattern made of a same material on a same layer, wherein each transparent conductive pattern has a comb shape comprising a plurality of teeth having different areas and each transparent conductive pattern forms a row or a column of the capacitive touch panel, and each transparent conductive pattern corresponds to one sensing line and transmits touch signals therethrough, the method comprising:

forming a plurality of transparent conductive patterns on a base substrate through one mask patterning process.

15. The capacitive touch panel according to claim 2, wherein, among the plurality of transparent conductive patterns, neighboring edge lines of at least one pair of adjacent transparent conductive patterns are parallel to each other.

16. The capacitive touch panel according to claim 2, wherein edges of adjacent two transparent conductive patterns are in a form of gear engagement.

17. The capacitive touch panel according to claim 2, wherein the transparent conductive patterns each have a same shape.

18. The capacitive touch panel according to claim 2, wherein the transparent conductive patterns transmit the tough signals through a sensing line arranged in an edge region of the capacitive touch panel.

* * * * *